(12) United States Patent
Feldman et al.

(10) Patent No.: US 6,824,427 B1
(45) Date of Patent: Nov. 30, 2004

(54) COAXIAL PROBE INTERCONNECTION SYSTEM

(75) Inventors: Steven Feldman, Cedar Park, TX (US); Joseph N. Castiglione, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/436,835

(22) Filed: May 13, 2003

(51) Int. Cl.⁷ .................................................. H01R 9/28
(52) U.S. Cl. ........................ 439/581; 439/578; 439/942
(58) Field of Search ................................ 439/291, 482, 439/497, 942, 578–85, 219; 324/754, 758

(56) References Cited

U.S. PATENT DOCUMENTS

| | | | |
|---|---|---|---|
| 3,852,700 A | | 12/1974 | Haws |
| 4,296,990 A | * | 10/1981 | Stowers et al. ............. 439/557 |
| 4,606,603 A | * | 8/1986 | Cairns .......................... 385/58 |
| 4,632,485 A | * | 12/1986 | Brown et al. ............... 439/330 |
| 4,729,752 A | | 3/1988 | Dawson |
| 4,851,765 A | * | 7/1989 | Driller et al. ............... 324/761 |
| 4,931,726 A | * | 6/1990 | Kasukabe et al. .......... 439/482 |
| 5,344,340 A | * | 9/1994 | Bouleau ..................... 439/581 |
| 6,037,787 A | | 3/2000 | Corwith |
| 6,066,957 A | | 5/2000 | Van Loan |
| 6,184,460 B1 | | 2/2001 | Bertoncini |
| 6,409,550 B1 | | 6/2002 | Splichal |
| 6,447,328 B1 | | 9/2002 | Feldman |
| 6,491,545 B1 | * | 12/2002 | Spiegel et al. .............. 439/579 |
| 6,551,126 B1 | | 4/2003 | Feldman |

FOREIGN PATENT DOCUMENTS

EP        0317191       5/1989

OTHER PUBLICATIONS

Emory, Harry, "Automated Probing of High–Speed Analog/Mixed Boards", Electronic Test, Jun. 1, 1988, pp. 76–82, vol. 11, No. 6, San Francisco, CA.

* cited by examiner

Primary Examiner—Renee Luebke
(74) Attorney, Agent, or Firm—Melanie G. Gover

(57) ABSTRACT

A coaxial probe interconnection system includes a carrier assembly and a probe holder. The carrier assembly contains first coaxial connector halves. Each first coaxial connector half is terminated to an associated coaxial cable. The probe holder assembly contains coaxial probe connectors. Each coaxial probe connector includes a spring probe at a first end and a second coaxial connector half at a second end. Each second coaxial connector half slidably mates with a corresponding first coaxial connector half in the carrier assembly.

38 Claims, 10 Drawing Sheets

COAXIAL PROBE INTERCONNECTION SYSTEM

THE FIELD OF THE INVENTION

The present invention generally relates to spring probe assemblies of the type used in automatic test equipment, and more particularly to an interconnection system for use with spring probe assemblies.

BACKGROUND OF THE INVENTION

Spring probes are used to provide temporary spring contact interfaces between integrated circuits or other electronic equipment and automated test equipment. Spring probes are used in a wide variety of different assemblies for this purpose. When testing at signal speeds in the gigahertz range, a spring probe is often provided in a coaxial probe connector, and a plurality of coaxial probe connectors are arranged in a probe holder to form an ordered spring probe assembly. The probe holder may be, for example, a probe block or a probe plate. The coaxial probe connectors are securely held by the probe holder, such as by press-fitting the coaxial probe connectors into the probe holder, so as to ensure low electrical resistance between the probe connector shield body and the probe holder and to ensure precise location of the spring probes in the holder. Before they are secured in the probe holder, each of the coaxial probe connectors is individually terminated to a coaxial cable at one end prior to being press-fitted into the probe holder.

As integrated circuits and other electronic equipment continue to evolve by becoming faster and smaller, the automated test equipment and associated spring probe assemblies also must evolve. In particular, the electrical performance requirements of spring probe assemblies (in terms of impedance control of the system) are being raised, and the density of coaxial probe connectors in the probe holder is increasing. The high electrical performance requirements result in little tolerance for even slightly defective or damaged components in spring probe assemblies. As a result, the ability to easily and quickly replace or repair components of the spring probe assemblies is desirable. However, the increasing density of coaxial probe connectors (and their associated coaxial cables) in spring probe assemblies makes it increasingly difficult to repair or replace components without causing damage to other components in the assembly. As a result, it is very costly to manufacture and maintain spring probe assemblies.

What is needed is a spring probe assembly that facilitates the assembly, repair and replacement of coaxial probe connectors, their components and associated coaxial cables without requiring extensive re-work or even scraping of the entire spring probe assembly. In particular, a need exists for a spring probe assembly which reduces the likelihood of inflicting damage to coaxial probe connectors and coaxial cables when maintaining the spring probe assembly.

SUMMARY OF THE INVENTION

The coaxial probe interconnection system according to the present invention provides the ability to quickly and easily assemble, repair or replace any portion of the interconnection system, while reducing the likelihood of damage to other components of the interconnection system.

In one embodiment according to the invention, a coaxial probe interconnection system includes a carrier assembly and a probe holder. The carrier assembly contains a set of first coaxial connector halves, with each first coaxial connector half terminated to an associated coaxial cable. The probe holder assembly contains at least one set of coaxial probe connectors. Each coaxial probe connector includes a spring probe at a first end and a second coaxial connector half at a second end. Each second coaxial connector half slidably mates with a corresponding first coaxial connector half in the carrier assembly.

In another embodiment according to the invention, a coaxial probe interconnection system includes a plurality of carrier assemblies for each probe holder. Each of the plurality of carrier assemblies contains a set of first coaxial connector halves for engaging one of a plurality of sets of coaxial probe connectors contained in the probe holder.

In yet another embodiment according to the invention, the first coaxial connector halves of a carrier assembly are inserted into the carrier assembly in a direction transverse to the connector mating direction.

The above summary of the present invention is not intended to describe each disclosed embodiment or every implementation of the present invention. The Figures and the detailed description which follow more particularly exemplify illustrative embodiments.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
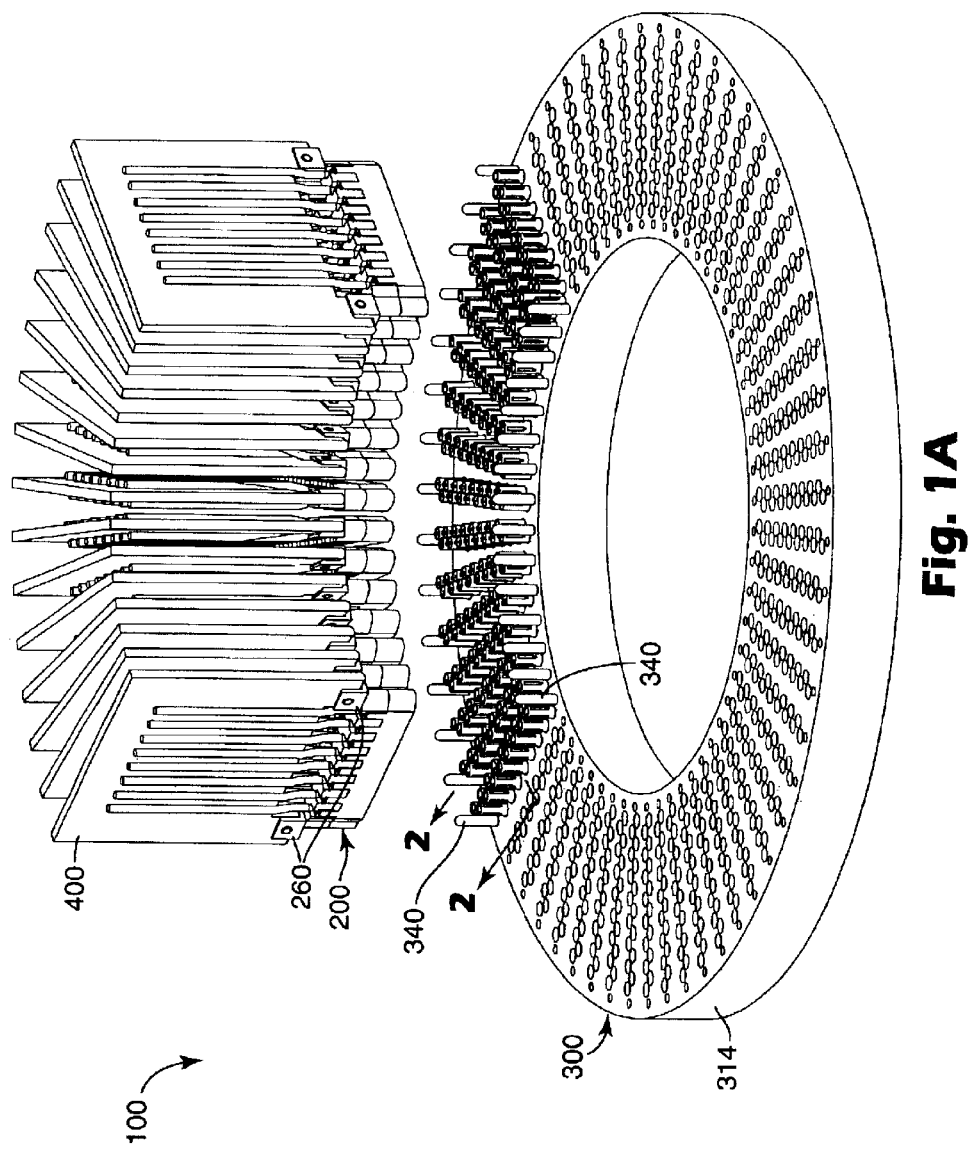
FIG. 1A is a perspective view of a carrier assembly and probe holder assembly according to the invention in a separated condition.
Figure 1B:
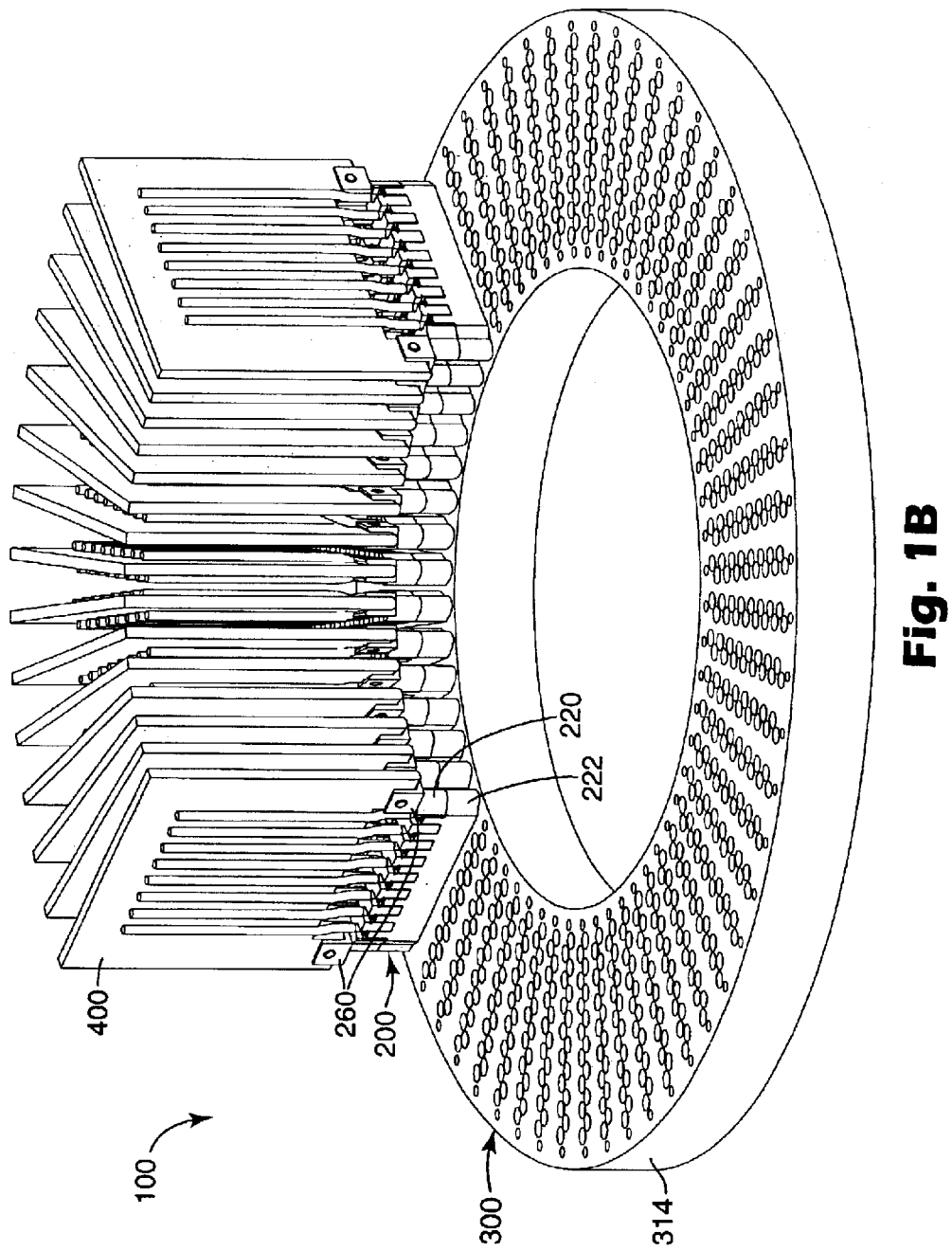
FIG. 1B is a perspective view of a carrier assembly and probe holder assembly of FIG. 1A in a mated condition.

FIGS. 1A and 1B provide perspective views of one embodiment of a coaxial probe interconnection system 100 according to the invention. The coaxial probe interconnection system 100 includes at least one carrier assembly 200 and a probe holder assembly 300. In one embodiment of the invention, coaxial probe interconnection system 100 includes a plurality of carrier assemblies 200. Each carrier assembly 200 is capable of independently engaging or disengaging with probe holder assembly 300.

Figure 2:
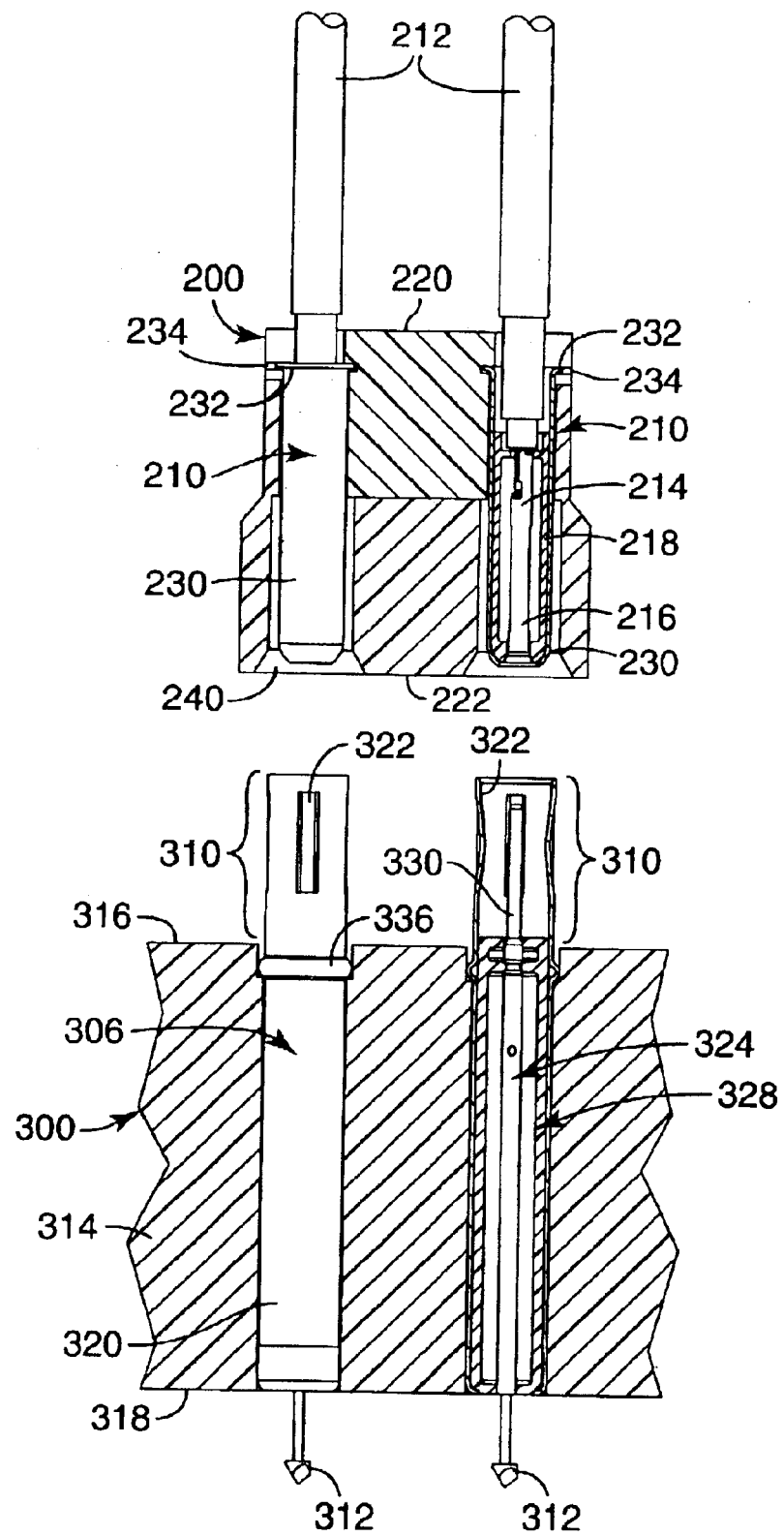
FIG. 2 is a cross-sectional view of a carrier assembly and probe holder assembly, taken along line 2—2 of FIG. 1A.

As shown in FIG. 2, each carrier assembly 200 contains a set of first coaxial connector halves 210. Each first coaxial connector half 210 is terminated to an associated coaxial cable 212. Coaxial cables 212 are in turn connected to a test or measurement system (not shown). Probe holder assembly 300 contains a plurality of coaxial probe connectors 306. Each coaxial probe connector 306 has at one end a second coaxial connector half 310. First and second coaxial connector halves 210, 310 are arranged in their respective carrier assemblies 200 and probe holder assembly 300 such that each first coaxial connector half 210 slidably engages and mates with a corresponding second coaxial connector half 310. As illustrated herein, first coaxial connector halves 210 are female coaxial connectors, and second coaxial connector halves 310 are male coaxial connectors. However, in other embodiments according to the invention, first coaxial connector halves 210 are male coaxial connectors, and second coaxial connector halves 310 are female coaxial connectors.

Figure 3A:
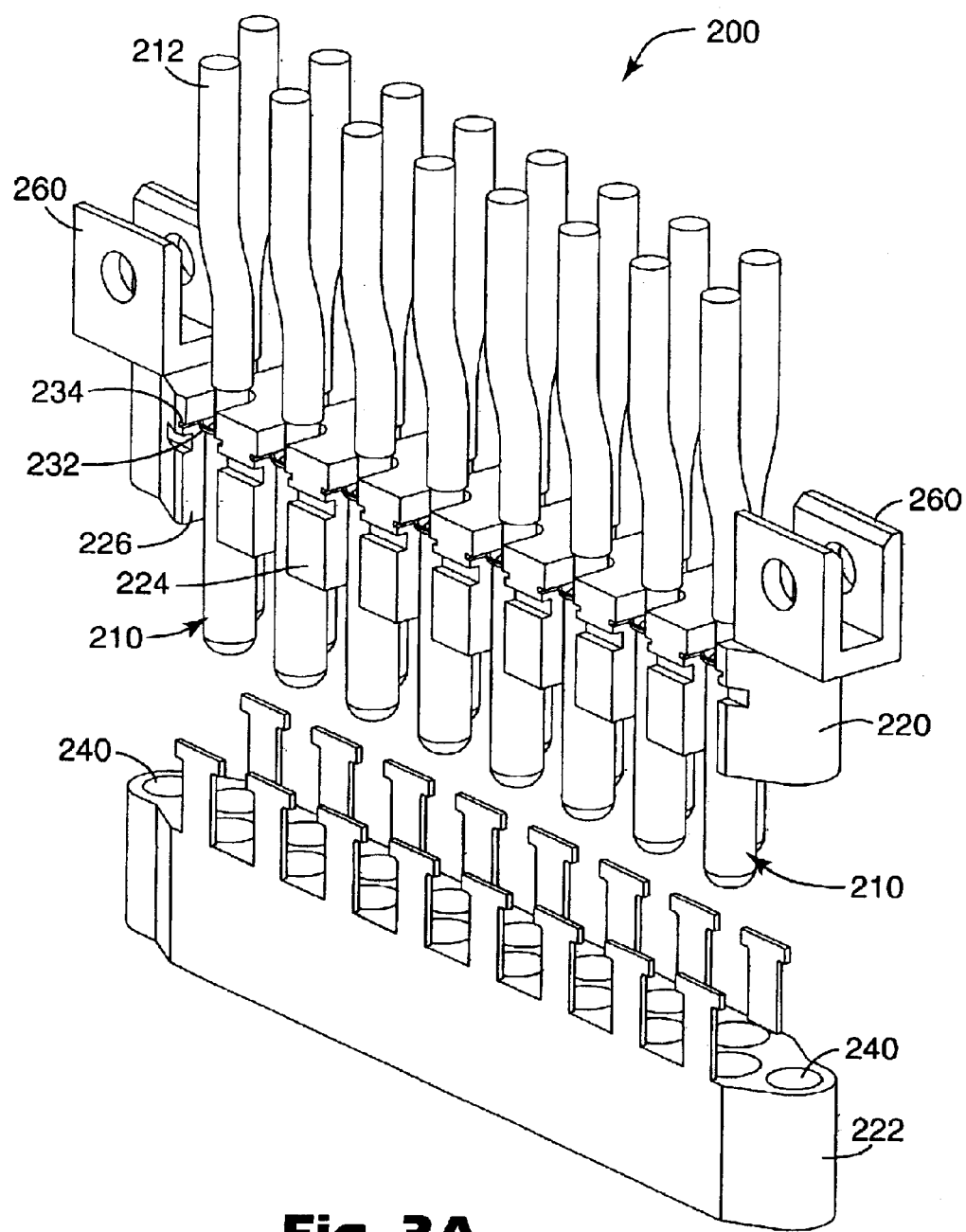
FIG. 3A is a partially exploded perspective view of a carrier assembly of FIGS. 1A and 1B.
Figure 3B:
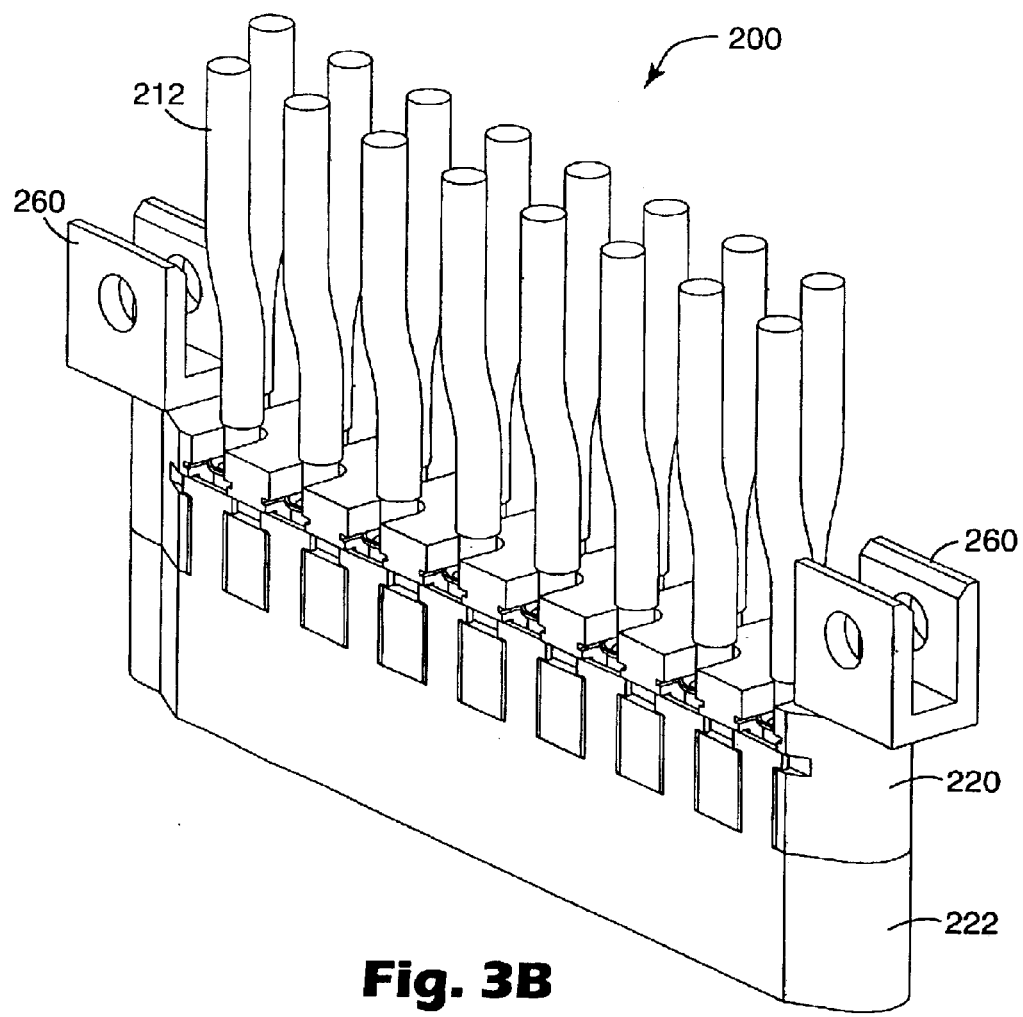
FIG. 3B is a perspective view of the carrier assembly of FIG. 2A in an assembled condition.

One carrier assembly 200 is described in greater detail with reference to FIGS. 3A and 3B. Carrier assembly 200 includes a carrier body 220 and a carrier retainer 222. Carrier body 220 has a plurality of longitudinal channels 226 on its side surfaces 224. Each channel 226 is sized and positioned to receive and contain one first coaxial connector half 210.

As best seen in FIG. 2, each first coaxial connector half 210 includes signal conductor 214 having at one end a socket contact 216 for receiving a signal pin 330 of a mating second coaxial connector half 310. An insulator 218 axially locates and retains signal conductor 214 and socket contact 216 within a longitudinal ground tube 230. The longitudinal axis of ground tube 230 defines an engagement or mating direction of the coaxial connector half 210.

In one embodiment according to the invention, insulator 218 is a structural dielectric material disposed circumferentially around and spaced away from signal conductor 214. Insulator 218 makes only limited contact with signal conductor 214, thereby positioning as much as possible of the structural dielectric material of insulator 218 away from signal conductor 214. Specifically, insulator 218 contacts signal conductor 214 only as required to axially locate and retain signal conductor 214 within conductive ground tube 230. A majority of the dielectric insulator material is positioned away from the signal conductor 214 (e.g. closer to conductive ground tube 230 than to signal conductor 214) so that an air dielectric is immediately adjacent signal conductor 214 and the effective dielectric constant of the first coaxial connector half 210 is made less sensitive to manufacturing variations in the dimensions of insulator 218. In this manner, the characteristic impedance of the interconnection system is more accurately controlled.

Each ground tube 230 includes a transversely extending flange 232. Flange 232 is shaped to engage a mating slot 234 in carrier body 220. During assembly of carrier assembly 200, each first coaxial connector half 210 is inserted into a channel 226 of carrier body 220 in a direction transverse to th engagement or mating direction of the connector half 210. As the first coaxial connector half is inserted into a channel 226, flange 232 engages slot 234 and thereby restrains longitudinal movement of ground tube 230 (and thus first coaxial connector half 210) within its channel 226. After a first coaxial connector half 210 is inserted into each channel 226, carrier retainer 222 is releasably engaged with carrier body 220 to retain the first coaxial connector halves 210 within channels 226 of carrier body 220. When carrier body 220 and carrier retainer 222 are engaged, the bore containing each first coaxial connector half 210 is slightly larger than the outer diameter of outwardly deflected ground contacts 322 of second coaxial connector half 310. A close fit provides directional guidance when the components are mated, and in some embodiments according to the invention provides an over-stress stop in the event a stubbing condition develops between mating coaxial connector halves 210, 310.

Movement of the ground tube 230 (and thus first coaxial connector half 210) in directions transverse to the longitudinal axis of the ground tube 230 is limited by carrier retainer 222. In one embodiment, first coaxial connector halves 210 are free to rotate about their longitudinal axis to prevent kinking of coaxial cables 212. In some embodiments according to the invention, limited transverse movement of each first coaxial connector half 210 is preferred, to permit first and second coaxial connector halves 210, 310 to align as they are engaged. In one embodiment according to the invention, the range of transverse movement of each first coaxial connector half 210 within a carrier assembly 200 is greater than the range of longitudinal movement of each first coaxial connector half 210. In one embodiment, each rust coaxial connector half 210 is permitted to move transverse to the engagement or mating direction in the range of 0.005 to 0.025 inches. In another embodiment according to the invention, the first coaxial connector half 210 is permitted to move axially in the range of 0.001 to 0.010 inches.

In one embodiment according to the invention, carrier retainer 222 is configured to aid and encourage alignment of carrier assemblies 200 and probe holder assemblies 300. For example, carrier retainer 222 includes tapered openings 240 for guiding second coaxial connector halves 310 toward first coaxial connector halves 210 during mating of the carrier assembly 200 and probe holder assembly 300. In one embodiment according to the invention, carrier retainer 222 is engaged with carrier body 220 such that retainer 222 is movable with respect to carrier body 220, such that carrier retainer may accommodate and correct a greater range of misalignment (both linear and angular) between carrier assembly 200 and probe holder assembly 300. Carrier retainer 222 may be linearly movable, angularly moveable, or both, with respect to carrier body 220.

As illustrated in FIGS. 1A and 1B, each carrier assembly 200 may be mounted to an electronic assembly 400, such as a printed surface board. In one embodiment according to the invention, each carrier assembly 200 is mounted to the electronic assembly 400 via mounting brackets 260 so that carrier assembly 200 is linearly and/or angularly movable with respect to the electronic assembly. In this manner, as carrier assembly 200 is moved into engagement with probe holder assembly 300, carrier assembly 200 is permitted to make gross movements to assure alignment of first coaxial connector halves 210 and second coaxial connector halves 310.

Further alignment features such as alignment holes 240 and alignment pins 340 may optionally be included in carrier assembly 200 and probe holder assembly 300, respectively, to provide gross alignment and/or keying features for the components.

Probe holder assembly 300 as illustrated in FIGS. 1A and 1B uses a single plate 314 to hold all of the coaxial probe connectors 306. However, in alternate embodiments, plate 314 may be replaced with one or more probe blocks, where a plurality of probe blocks may be assembled into a larger unit. Regardless of the type of probe holder used, the principles according to the invention described herein are applicable.

Figure 4:
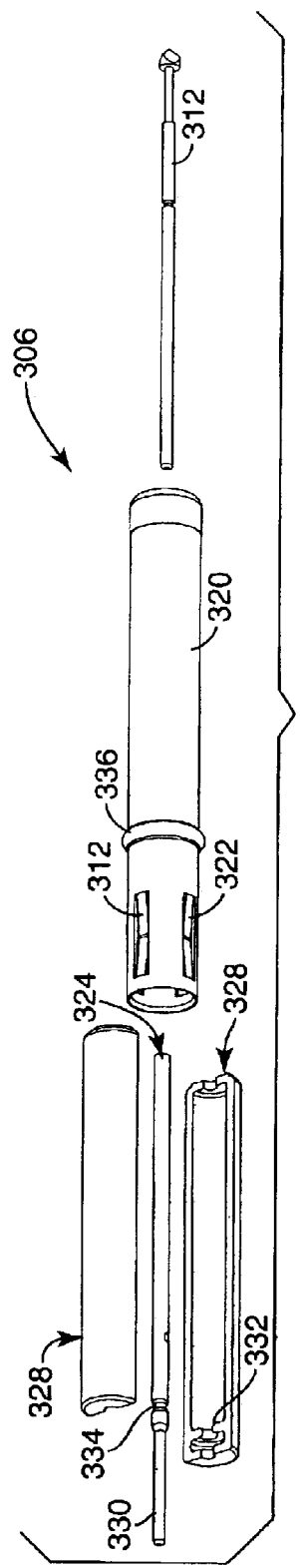
FIG. 4 is an enlarged exploded view of a coaxial probe connector.

Probe holder assembly 300 and its associated coaxial probe connectors 306 are best seen with reference to FIGS. 2 and 4. Each coaxial probe connector 306 includes second coaxial connector half 310 positioned adjacent a mating side 316 of the plate 314 and a spring probe 312 positioned adjacent an opposite side 318 of the plate 314.

Each coaxial probe connector 306 includes a conductive outer body 320 and a signal conductor 324 centered within conductive outer body 320. An insulator 328 separates signal conductor 324 from conductive outer body 320. The portion of conductive outer body 320 adjacent mating side 316 of plate 314 forms ground contacts 322 for making electrical ground contact with the ground tube 230 of a corresponding first coaxial connector half 210.

In one embodiment according to the invention, signal conductor 324 is a tubular member that removably retains the spring probe 312 at a first end thereof and forms a signal pin 330 at an opposite end. Signal pin 330 is configured for mating with a signal socket contact 216 of one of the first coaxial connector halves 210 in an associated carrier assembly 200. Signal pin 330 may be fabricated, for example, by forming a lead-in at the end of tubular signal conductor 324, and optionally, by reducing the tube diameter over the length which accepts the mating contact 216.

In one embodiment according to the invention, insulator 328 is a structural dielectric material disposed circumferentially around and spaced away from signal conductor 324. A majority of the dielectric insulator material is positioned away from the signal conductor 324 (e.g. closer to conductive outer body 320 than to signal conductor 324) so that an air dielectric is immediately adjacent signal conductor 324 and the effective dielectric constant of the coaxial probe connector 306 is made less sensitive to manufacturing variations in the dimensions of insulator 328. In this manner, the characteristic impedance of the interconnection system is more accurately controlled.

In one embodiment according to the invention, insulator 328 makes only limited contact with signal conductor 324, thereby positioning as much as possible of the dielectric material of insulator 328 away from signal conductor 324. Specifically, insulator 328 contacts signal conductor 324 only as required to axially locate and retain signal conductor 324 within conductive outer body 320. Insulator 328 is retained within conductive outer body 320 by any retention feature, such as dimples, an inwardly rolled collar, lances, or a combination thereof. Insulator 328 axially locates and retains signal conductor 324 within insulator 328 by providing a positioning element 332 on an interior surface of insulator 328. Positioning element 332 engages a reciprocal positioning element 334 on an outer surface of signal conductor 324. The positioning element 332 of the insulator 328 and reciprocal positioning element 334 of the signal conductor 324 are raised or indented features.

Figure 5A:
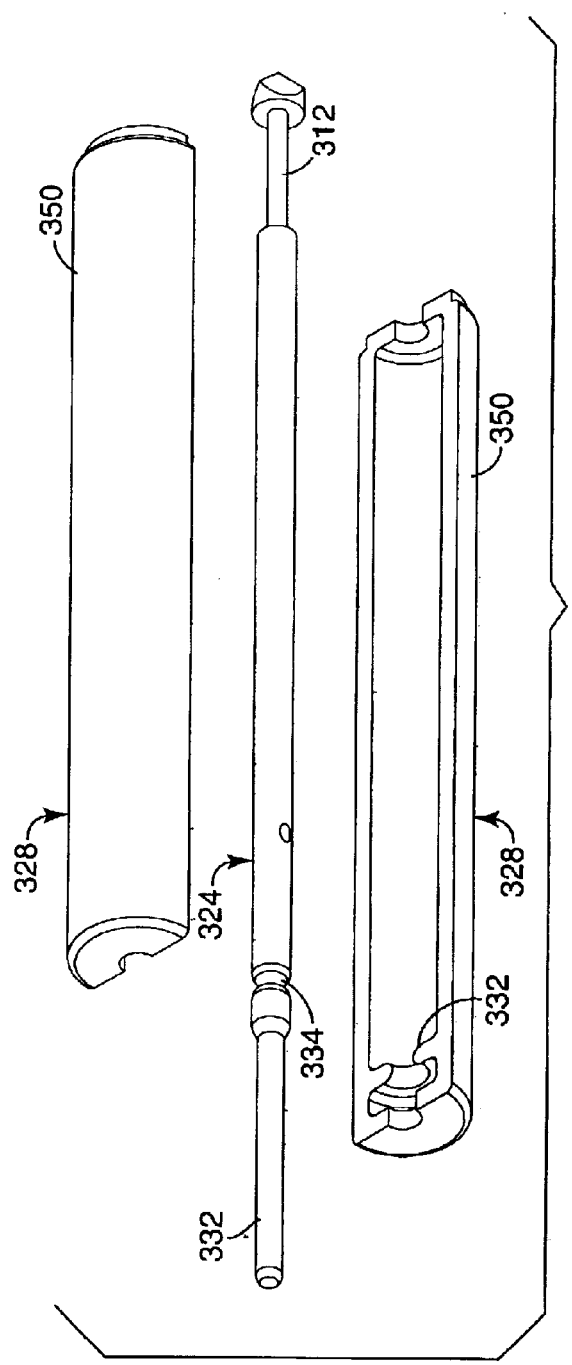
FIGS. 5A–5C are perspective views of alternate insulator embodiments according to the invention.
Figure 5B:
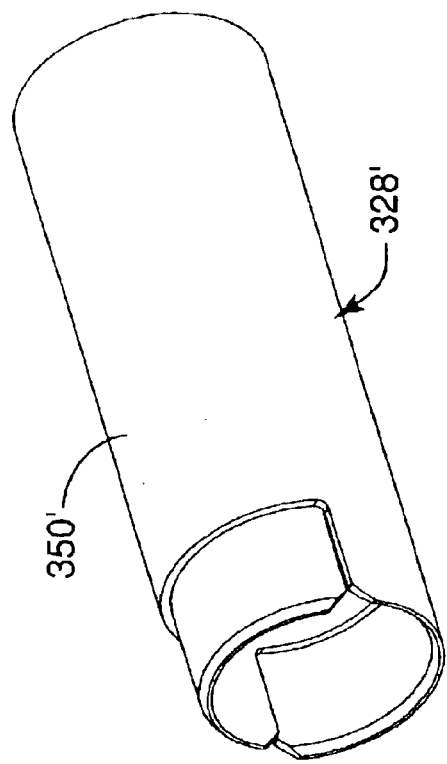
Figure 5B:
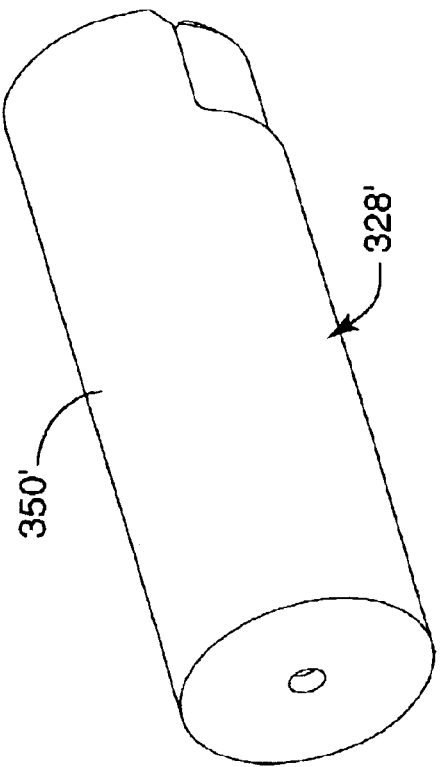
Figure 5C:
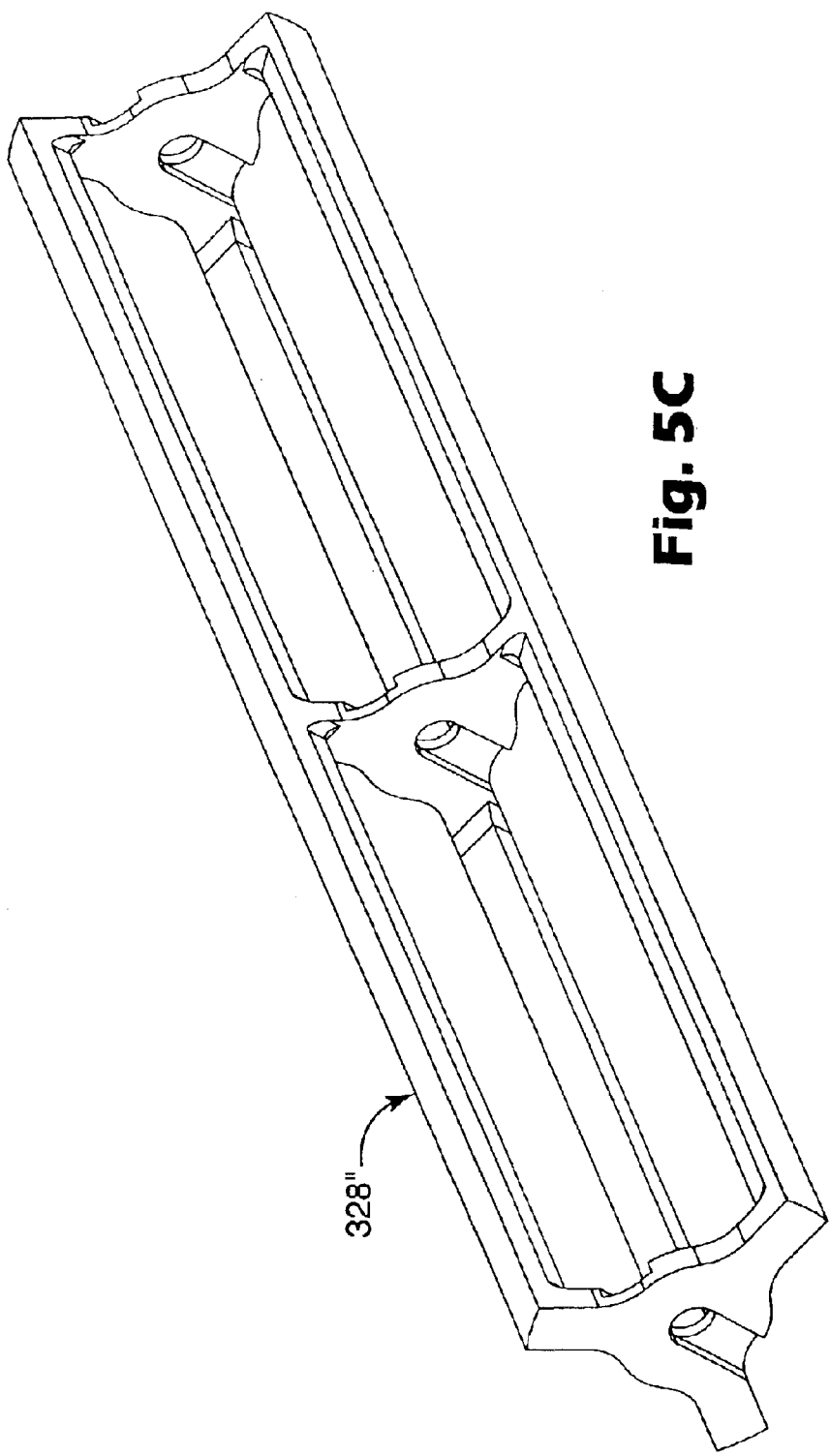

Exemplary embodiments of insulators according to the invention are shown in FIGS. 5A–5C. Insulator 328 of FIG. 4 is shown in FIG. 5a as two mating halves 350, each half 350 extending longitudinally along the length of signal conductor 324. Each half 350 of insulator 328 may be separately formed as illustrate in FIG. 5a. Alternately, insulator halves 350 may be integrally hinged in a clamshell fashion to facilitate molding or machining and to provide an ease of signal conductor insulation. After locating signal conductor 324 within the insulator 328, the assembled signal conductor 324 and insulator 328 is inserted into conductive outer body 320. Although FIG. 5A is described with reference to an insulator for coaxial probe connector 306, insulator 218 of first coaxial connector half 210 may be similarly constructed.

An alternate insulator embodiment is illustrated in FIG. 5B. Insulator 328' includes two mating halves 350', each half 350', which can be hermaphroditic, encompassing one-half the length of signal conductor 324. Insulator 328' preferably includes positioning elements (not shown) like that of insulator 328 for axially locating and retaining signal conductor 324. Although FIG. 5B is described with reference to an insulator for coaxial probe connector 306, insulator 218 of first coaxial connector half 210 may be similarly constructed.

Yet another alternate insulator embodiment is illustrated in FIG. 5C. Insulator 328" is formed as a single-piece extending longitudinally along the length of signal conductor 324. Insulator 328" is skeletonized to maximize the air dielectric surrounding signal conductor 324. Insulator 328" preferably includes positioning elements (not shown) like that of insulator 328 for axially locating and retaining signal conductor 324. Although FIG. 5C is described with reference to an insulator for coaxial probe connector 306, insulator 218 of first coaxial connector half 210 may be similarly constructed.

As noted above, coaxial probe connectors 306 are press-fit into plate 314. To aid the insertion and longitudinal positioning of coaxial probe connectors 306 within holder 314, conductive outer body 320 is optionally provided with a radially extending ridge or collar 336 on its exterior surface. Collar 336 provides a bearing surface for pressing coaxial probe connector 306 into the plate 314 (reducing the likelihood of damaging coaxial probe connector 306 or second connector halves 310), and further provides an insertion "stop" for precisely locating connector 306 in plate 314.

Figure 6A:
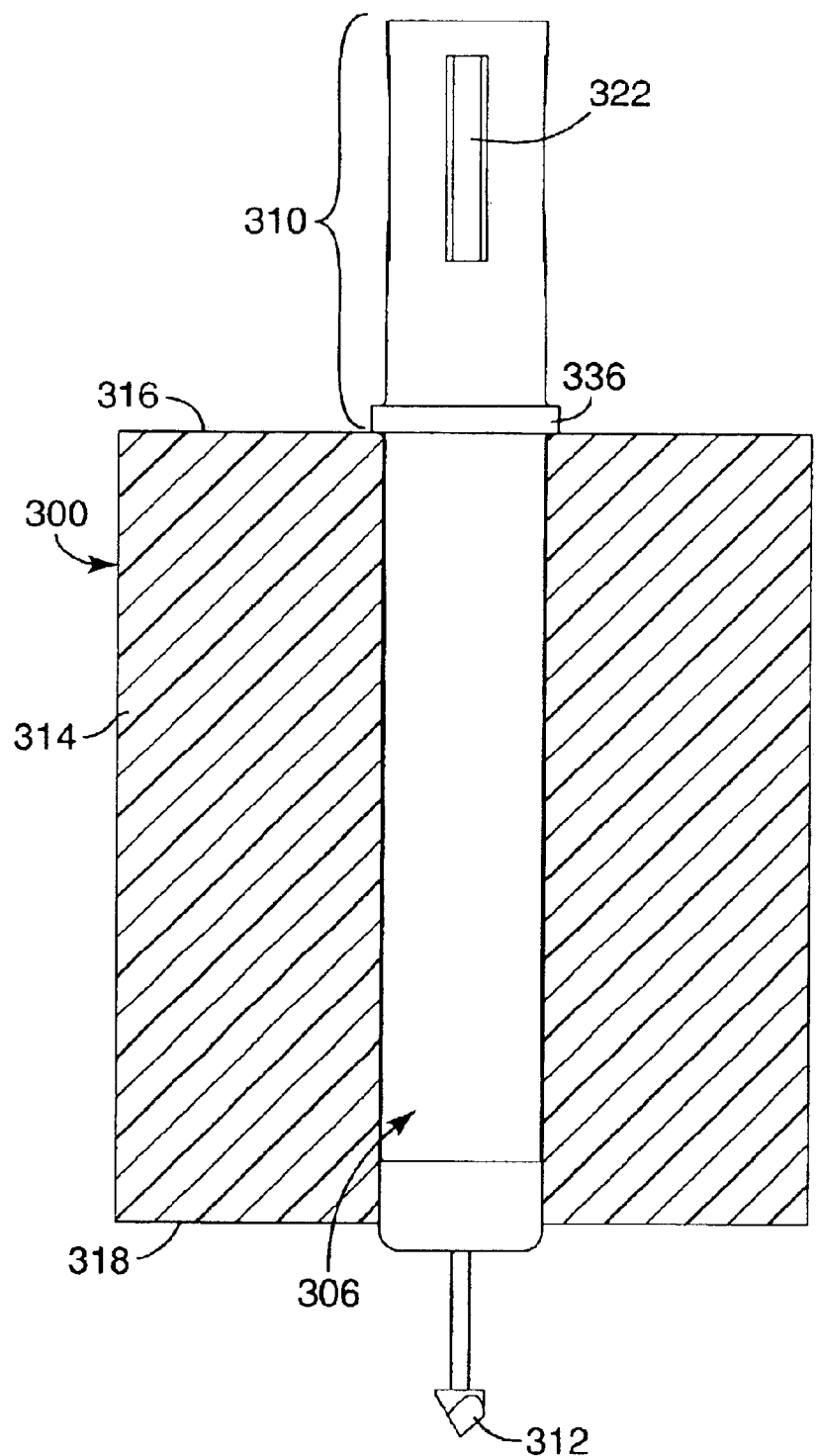
FIGS. 6A–6B are cross-sectional views of alternate embodiments of the probe holder assembly according to the invention.
Figure 6B:
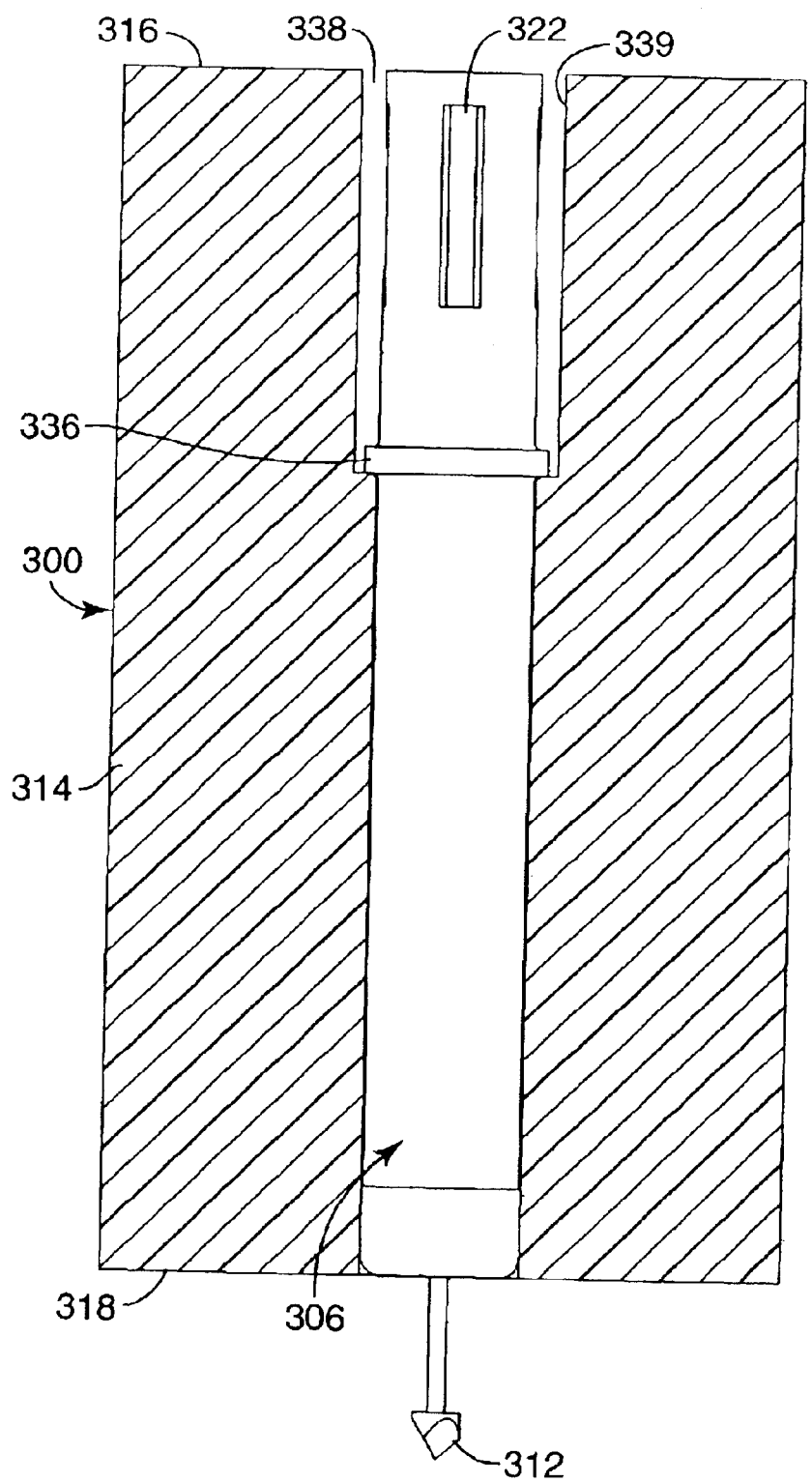

In one embodiment according to the invention illustrated in FIG. 6A, second coaxial connector halves 310 extend above mating side 316 of plate 34. In another embodiment illustrated in FIG. 6B, second coaxial connector halves 310 are "counter-sunk" below mating side 316 in bore 338, such that second coaxial connector halves 310 are shrouded by plate 314. In the embodiment of FIG. 6B, second coaxial connector halves 310 are protected from damage, such as by stubbing of connector halves 310. Additionally, in some embodiments according to the invention, walls 339 of the plate 314 act as over-stress stops, preventing ground contacts 322 of second coaxial connector halves 310 from deflecting to a point of permanent deformation.

The coaxial probe interconnection system 100 described herein provides the ability to quickly and easily assemble, repair or replace any portion of the system, while reducing the likelihood of damage to other components of the system. In particular, when a plurality of carrier assemblies 200 are engaged to probe holder assembly 300, a single carrier assembly 200 containing a damaged component (such a coaxial cable 212 or a first coaxial connector half 210) may be easily disengaged and removed from probe holder assembly 300. While separated from probe holder assembly 300, the carrier retainer 222 of the disengaged carrier assembly is easily disengaged from carrier body 220, such that a single first coaxial connector half 210 and associated coaxial cable 212 may be further separated from the remainder of the system, for example, to replace the coaxial cable 212 or first coaxial connector half 210. It is unnecessary to forcibly press or pull the component from its carrier 200.

Similarly, if a coaxial probe connector 306 requires repair or replacement, carrier assemblies 200 may be easily removed from probe holder assembly 300 (so as not to damage coaxial cables 212 and their associated connections)

and the defective or damaged coaxial probe connector 306 pressed out of probe holder 300. After work is completed on probe holder assembly 300, the carrier assemblies 200 may be re-mated with the probe holder assembly, and use of the system resumed.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A coaxial probe interconnection system comprising:
   a carrier assembly containing a set of first coaxial connector halves, each first coaxial connector half terminated to an associated coaxial cable; and
   a probe holder containing at least one set of coaxial probe connectors, each coaxial probe connector comprising a spring probe at a first end and a second coaxial connector half at a second end, each second coaxial connector half configured to slidably mate with a corresponding first coaxial connector half.

2. The system of claim 1, further comprising:
   a plurality of carrier assemblies, each carrier assembly containing a set of first coaxial connector halves; and
   a plurality of sets of coaxial probe connectors contained in the probe holder.

3. The system of claim 1, wherein each first coaxial connector half has a mating direction, and wherein each first coaxial connector half is inserted into the carrier assembly in a direction transverse to the mating direction.

4. The system of claim 1, wherein the carrier assembly comprises:
   a carrier body having a plurality of channels, each channel containing one of the set of first coaxial connector halves; and
   a carrier retainer engaged with the carrier body and retaining the first coaxial connector halves within the channels of the carrier body.

5. The system of claim 4, wherein each first coaxial connector half comprises a longitudinal ground tube having a transversely extending flange engaged with a mating slot in the carrier body.

6. The system of claim 5, wherein longitudinal movement of each ground tube within the carrier body is restrained by the transversely extending flange engaged with the mating slot in the carrier body.

7. The system of claim 4, wherein transverse movement of each ground tube within the carrier assembly is limited by the carrier retainer.

8. The system of claim 7, wherein a range of transverse movement of each ground tube within the carrier assembly is greater than a range of longitudinal movement of each ground tube within the carrier assembly.

9. The system of claim 8, wherein transverse movement of each ground tube is in the range of 0.005 to 0.025 inches.

10. The system of claim 8, wherein longitudinal movement of each ground tube is in the range of 0.001 to 0.010 inches.

11. The system of claim 4, wherein the carrier retainer comprises tapered openings for guiding the second coaxial connector halves into alignment with the first coaxial connector halves.

12. The system of claim 4, wherein the carrier retainer is moveable with respect to the carrier body to align with the second coaxial connector halves during mating of the first coaxial connector halves and the second coaxial connector halves.

13. The system of claim 12, wherein the carrier retainer is linearly moveable with respect to the carrier body.

14. The system of claim 12, wherein the carrier retainer is angularly moveable with respect to the carrier body.

15. The system of claim 1, wherein the first coaxial connector halves comprise female connector halves, and wherein the second coaxial connector halves comprise male connector halves.

16. The system of claim 1, wherein each spring probe is positioned adjacent a first face of the probe holder and wherein each second coaxial connector half is positioned adjacent a second face of the probe holder opposite the first face.

17. The system of claim 1, wherein each of the coaxial probe connectors further comprises:
    a conductive outer body;
    a signal conductor centered within the conductive outer body; and
    an insulator separating the signal conductor from the conductive outer body.

18. The system of claim 17, wherein the signal conductor of each coaxial probe connector comprises a tubular member, the tubular member removeably retaining the spring probe in a first end and forming a signal pin for mating with a signal socket contact of one of the first coaxial connector halves at a second end.

19. The system of claim 18, wherein at least a portion of the signal pin has a diameter smaller than a diameter of the tubular member, and wherein the mating signal socket contact has a diameter substantially the same or smaller than the diameter of the tubular member.

20. The system of claim 17, wherein a majority of the insulator is positioned closer to the conductive outer body than to the signal conductor.

21. The system of claim 17, wherein the insulator comprises a tubular shell disposed circumferentially spaced away from the signal conductor.

22. The system of claim 21, wherein the insulator comprises a structural dielectric material, and wherein the thickness of the circumferentially disposed dielectric material provides a desired effective dielectric constant for controlling a characteristic impedance of the interconnection system.

23. The system of claim 21, wherein an interior surface of the insulator includes a positioning element engaged with a reciprocal positioning element on an outer surface of the signal conductor.

24. The system of claim 23, wherein positioning element of the insulator and the reciprocal positioning element of the signal conductor axially locate and retain the signal conductor within the insulator.

25. A device comprising:
    a plurality of coaxial probe connectors secured in a probe holder, each of the plurality of coaxial probe connectors comprising a spring probe positioned adjacent a first side of the probe holder and a male coaxial connector positioned adjacent a second side of the probe holder; and a plurality of female coaxial connectors, each one of the plurality of female coaxial connectors engaged with a corresponding one of the male coaxial connectors and terminated to an associated coaxial cable.

26. The device of claim 25, further comprising a detachable carrier, the detachable carrier retaining a portion of the plurality of female coaxial connectors in a pattern that matches a pattern of a portion of the plurality of male coaxial connectors.

27. The device of claim 26, wherein each of the plurality of female coaxial connectors retained in the detachable carrier are rotable about their longitudinal axis within the detachable carrier.

28. The device of claim 26, wherein the detachable carrier is movable in a mating direction to selectively mate the female coaxial connectors retained in the detachable carrier with their corresponding male coaxial connectors.

29. The device of claim 28, wherein each of the plurality of female coaxial connectors retained in the detachable carrier is inserted into the detachable carrier in a direction transverse to the mating direction.

30. The device of claim 29, wherein each of the plurality of female coaxial connectors retained in the detachable carrier are moveable in a direction transverse to the mating direction.

31. The device of claim 29, further comprising a carrier retainer removably secured to the detachable carrier, the carrier retainer limiting movement of the retained female coaxial connectors in the direction transverse to the engagement direction.

32. The device of claim 25, further comprising a plurality of detachable carriers, each detachable carrier retaining a portion of the plurality of female coaxial connectors in a pattern that matches a pattern of a portion of the plurality of male coaxial connectors, wherein each of the plurality of detachable carriers is independently movable in a direction away from the second side of the probe holder to disengage the female coaxial connectors retained in the detachable carrier from their corresponding male coaxial connectors.

33. The device of claim 25, wherein the male coaxial connector comprises:

a ground contact extending from a conductive outer body of the coaxial probe connector to engage a shield member of one of the plurality of female coaxial connectors; and a signal conductor axially aligned within the conductive outer body, the signal conductor removeably retaining the spring probe at a first end and forming a signal pin for mating with one of the plurality of female coaxial connectors at a second end.

34. The device of 33, further comprising an insulator between the conductive outer body and the signal conductor, the insulator positioned apart from the signal conductor along a majority of the length of the signal conductor in an impedance controlling relationship.

35. The device of claim 26, further comprising a electronic assembly mounted to the detachable carrier.

36. The device of claim 35, wherein the detachable carrier is angularly moveable with respect to the electronic assembly.

37. The device of claim 35, wherein the detachable carrier is linearly moveable with respect to the electronic assembly.

38. The device of claim 25, wherein the male coaxial connector is shrouded by the probe holder.

* * * * *

UNITED STATES PATENT AND TRADEMARK OFFICE
CERTIFICATE OF CORRECTION

PATENT NO. : 6,824,427 B1
DATED : November 30, 2004
INVENTOR(S) : Feldman, Steven It is certified that error appears in the above-identified patent and that said Letters Patent is hereby corrected as shown below:

Column 3,
Line 58, delete "th" and insert -- the -- therefor.

Column 4,
Line 21, delete "rust" and insert -- first -- therefor.

Column 6,
Line 36, delete "34" and insert -- 314 -- therefor.

Column 8,
Line 32, delete "removeably" and insert -- removably -- therefor.

Column 9,
Line 12, delete "rotable" and insert -- rotatable -- therefor.

Column 10,
Line 15, delete "removeably" and insert -- removably -- therefor.

Signed and Sealed this

Seventeenth Day of May, 2005

JON W. DUDAS
*Director of the United States Patent and Trademark Office*